(12) United States Patent
Ma et al.

(10) Patent No.: US 9,117,677 B2
(45) Date of Patent: Aug. 25, 2015

(54) SEMICONDUCTOR INTEGRATED CIRCUIT HAVING A RESISTOR AND METHOD OF FORMING THE SAME

(75) Inventors: Wei Yu Ma, Taitung (TW); Kuo-Ji Chen, Taipei County (TW); Fang-Tsun Chu, Taichung (TW); Ta-Pen Guo, Cupertino, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 447 days.

(21) Appl. No.: 13/272,389

(22) Filed: Oct. 13, 2011

(65) Prior Publication Data

US 2013/0093052 A1 Apr. 18, 2013

(51) Int. Cl.
| | |
|---|---|
| *H01L 27/06* | (2006.01) |
| *H01L 21/768* | (2006.01) |
| *H01L 27/02* | (2006.01) |
| *H01L 23/522* | (2006.01) |

(52) U.S. Cl.
CPC ........ *H01L 27/0266* (2013.01); *H01L 23/5228* (2013.01); *H01L 27/0629* (2013.01); *H01L 21/76895* (2013.01); *H01L 2924/0002* (2013.01)

(58) Field of Classification Search
USPC .................. 257/533, 758, E23.141, E23.142, 257/E23.145, E23.169, E23.175, E23.151, 257/E21.575
See application file for complete search history.

(56) References Cited

U.S. PATENT DOCUMENTS

| | | | | |
|---|---|---|---|---|
| 2005/0104177 A1* | 5/2005 | Lin et al. | ........................ | 257/678 |
| 2006/0060973 A1* | 3/2006 | Lin et al. | ........................ | 257/758 |
| 2007/0183104 A1* | 8/2007 | Tseng | ............... | 361/56 |
| 2008/0079461 A1* | 4/2008 | Lin et al. | ........................ | 326/80 |
| 2008/0080111 A1* | 4/2008 | Lin et al. | ........................ | 361/56 |
| 2008/0080112 A1* | 4/2008 | Lin et al. | ........................ | 361/56 |
| 2008/0080113 A1* | 4/2008 | Lin et al. | ........................ | 361/56 |
| 2008/0081457 A1* | 4/2008 | Lin et al. | ....................... | 438/614 |
| 2008/0081458 A1* | 4/2008 | Lin et al. | ....................... | 438/620 |
| 2008/0111242 A1* | 5/2008 | Lin et al. | ....................... | 257/758 |
| 2008/0251924 A1* | 10/2008 | Lin et al. | ....................... | 257/758 |
| 2009/0146305 A1* | 6/2009 | Lin et al. | ....................... | 257/751 |
| 2010/0246152 A1* | 9/2010 | Lin et al. | ....................... | 361/783 |

\* cited by examiner

*Primary Examiner* — Michael Lebentritt
*Assistant Examiner* — Jordan Klein
(74) *Attorney, Agent, or Firm* — Lowe Hauptman & Ham, LLP

(57) ABSTRACT

The present application discloses a semiconductor integrated circuit including a substrate having electrical devices formed thereon, a local interconnection layer formed over the substrate, and a global interconnection layer formed over the local interconnection layer. The local interconnection layer has a first set of conductive structures arranged to electrically connect within the individual electrical devices, among one of the electrical devices and its adjacent electrical devices, or vertically between the devices and the global interconnection layer. At least one of the first set of conductive structures is configured to have a resistance value greater than 50 ohms. The global interconnection layer has a second set of conductive structures arranged to electrically interconnect the electrical devices via the first set conductive structures.

20 Claims, 6 Drawing Sheets

SEMICONDUCTOR INTEGRATED CIRCUIT HAVING A RESISTOR AND METHOD OF FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
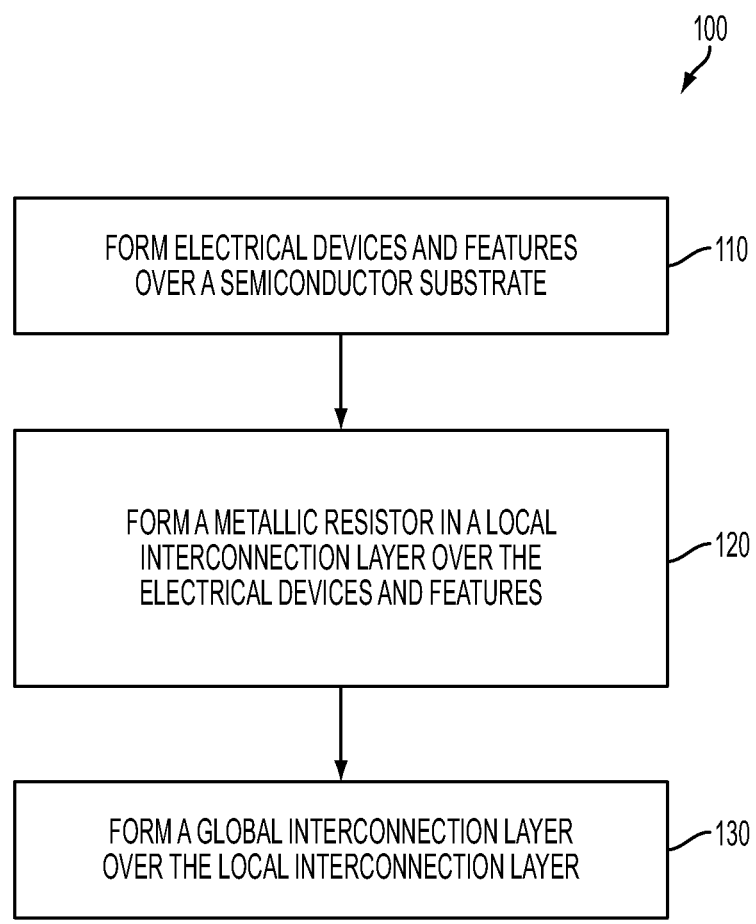
FIG. 1 is a flow chart of a method of forming a semiconductor integrated circuit (IC) in accordance with some embodiments.

It is understood that the following disclosure provides many different embodiments, or examples, for implementing different features of the disclosure. Specific examples of components and arrangements are described below to simplify the present disclosure. These are, of course, merely examples and are not intended to be limiting. In accordance with the standard practice in the industry, various features in the drawings are not drawn to scale and are used for illustration purposes only.

For a conductive structure having a length l, a width w, and a height h, a resistance value along a lateral direction of the conductive structure is determined by:

$$R = \rho \frac{l}{w \cdot h} = \rho' \frac{l}{w}$$

R is the resistance value, $\rho$ is resistivity of the conductive material for forming the conductive structure, and $\rho'$ is a unit resistance value given known values of the height l and the resistivity $\rho$ of the material for a particular semiconductor manufacturing process. For forming a resistor with a predetermined resistance value, the shorter the width and length of the conductive structure (i.e., the resistor), the smaller the area occupied by the resistor.

In some configurations, a resistor in a semiconductor integrated circuit is either a polysilicon resistor formed over a substrate or an active region resistor formed in the active region of the substrate, such as a P-well resistor or an N-well resistor. In at least one example semiconductor manufacturing process, polysilicon features and active region features of a semiconductor IC are more vulnerable to process variations than metallic features. Therefore, for achieving a predetermined level of accuracy, the minimum size of the polysilicon features and active region features is usually much greater than the minimum size of metallic features. For instance, in an example semiconductor manufacturing process, the minimum available size for a polysilicon feature is 360 nanometers (nm), the minimum available size for an active region feature is 360 nm for predetermined tolerance of electrical resistivity variation, and the minimum available size for a metallic feature is 10 nm for process limitation and predetermined tolerance of electrical resistivity variation. In the example process, a resistor formed by the metallic feature may occupy an area that is $\frac{1}{13}$-$\frac{1}{20}$ of the area occupied by a counterpart polysilicon or active region resistor.

FIG. 1 is a flow chart of a method 100 of forming a semiconductor integrated circuit in accordance with some embodiments. It is understood that additional processes may be provided before, during, and/or after the method 100 depicted in FIG. 1, and that some other processes may only be briefly described herein.

In operation 110, electrical devices and features (i.e., semiconductor components, lines, etc.) are formed over a semiconductor substrate. Subsequently, in operation 120, a local interconnection layer is formed over the substrate and/or over the electrical devices and features formed over the substrate. Then, in operation 130, a global interconnection layer is formed over the local interconnection layer.

The local interconnection layer has a set of conductive structures arranged to electrically connect features and components either: within the individual electrical devices; among one of the electrical devices and its adjacent devices; or vertically between the devices and the global interconnection layer. In at least one embodiment, at least one of the set of conductive structures of the local interconnection layer is arranged to have a resistance value greater than 50 ohms. The global interconnection layer has a set of conductive structures arranged to electrically interconnect the electrical devices via the set of conductive structures of the local interconnection layer.

Figure 2A:
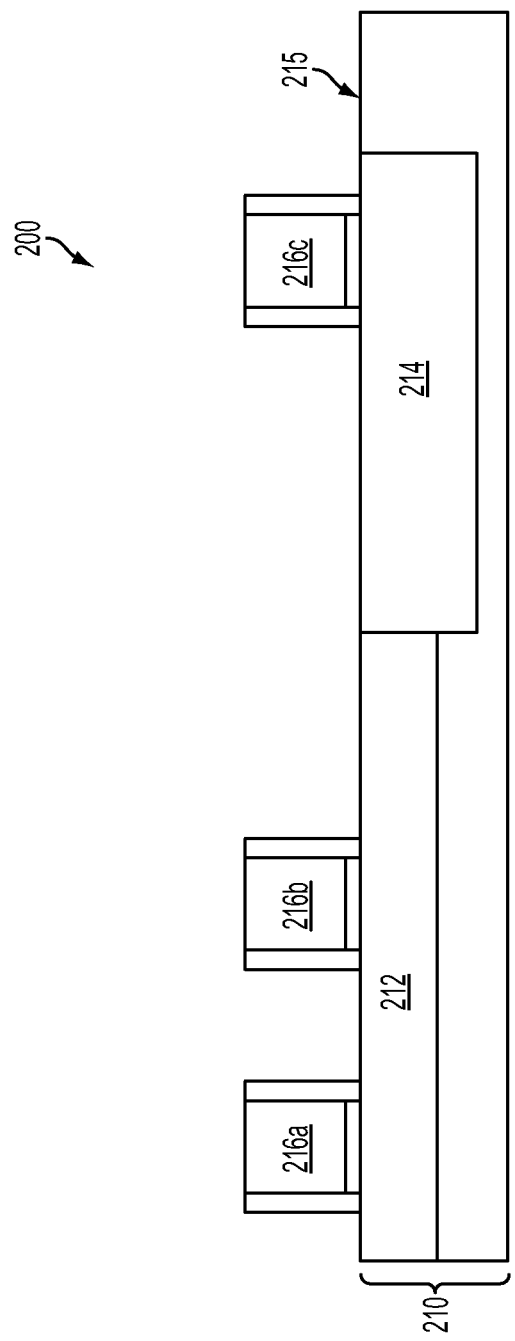
FIGS. 2A-2C are cross-sectional views of a portion of the integrated circuit at various fabrication stages in accordance with some embodiments.
Figure 2B:
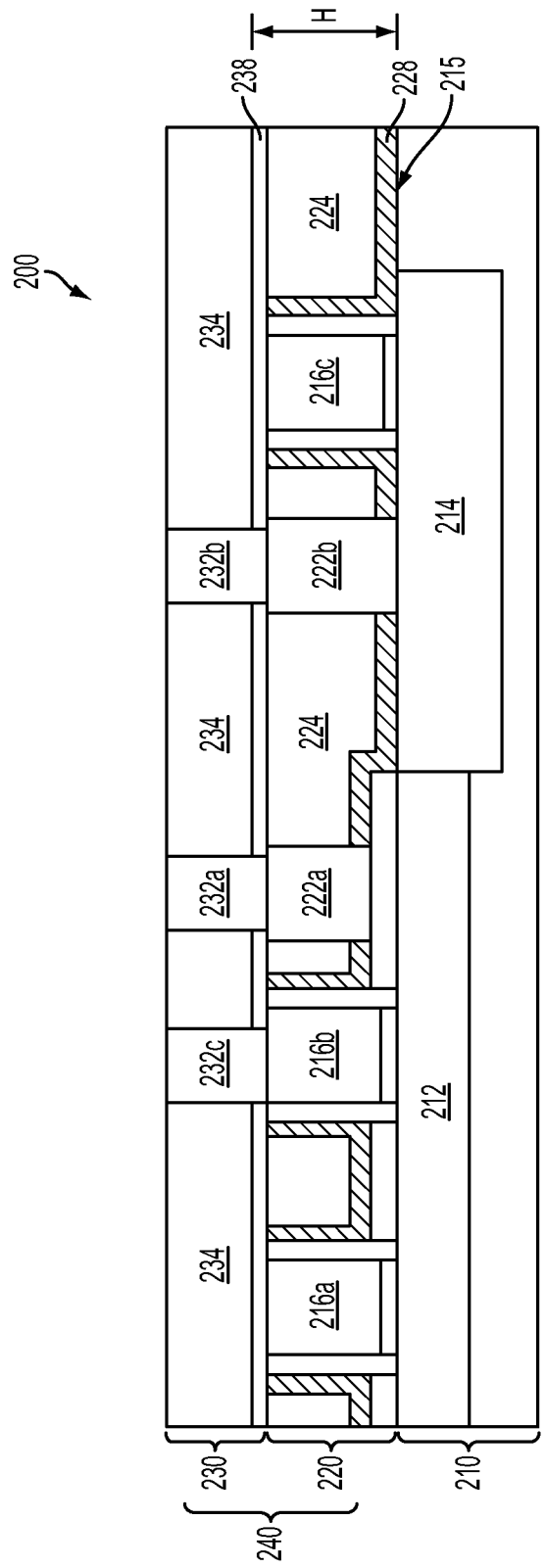
Figure 2C:
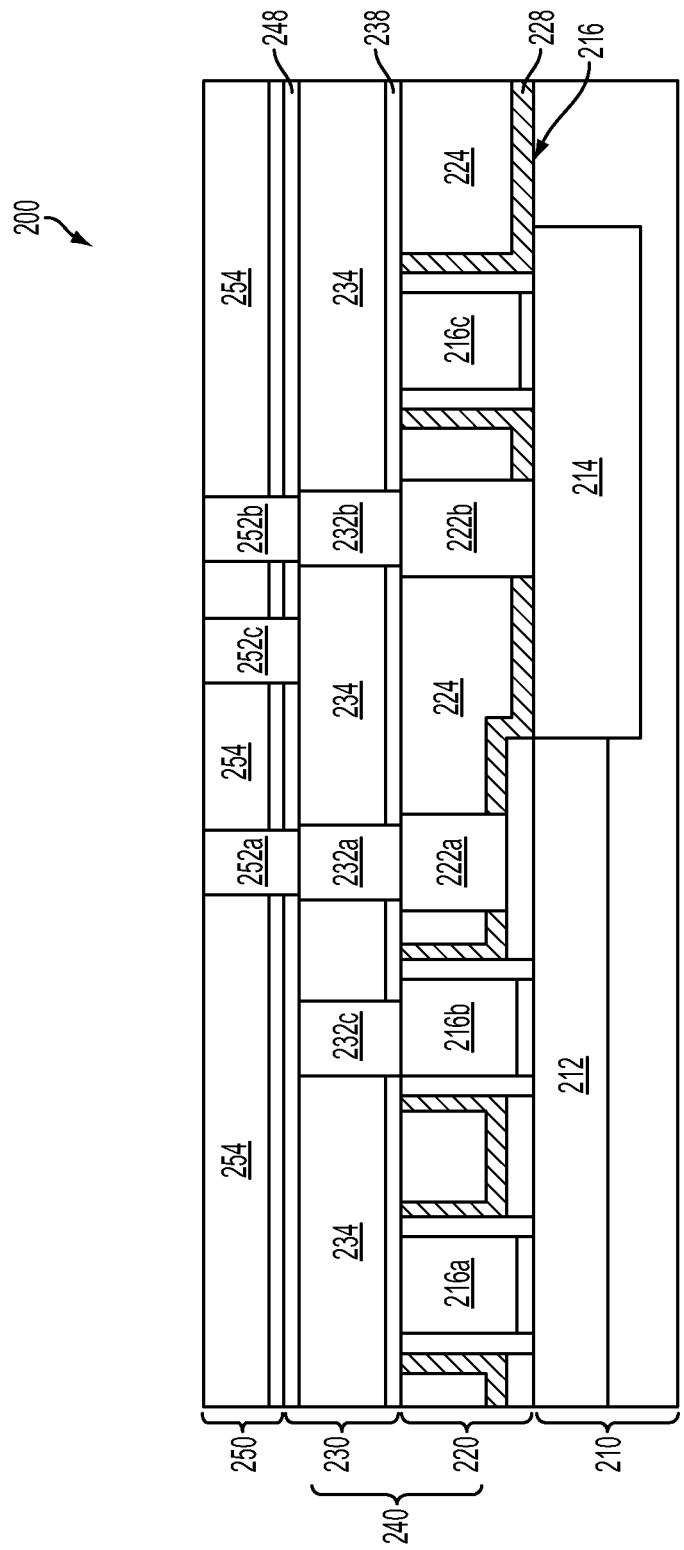

FIGS. 2A-2C are cross-sectional views of a portion of an integrated circuit (IC) 200 at various fabrication stages, in accordance with some embodiments. In FIG. 2A, integrated circuit 200 includes a substrate 210 having an active region 212 formed therein. A field oxide structure 214 is also formed within or, in some alternative embodiments, over the substrate 210. In some embodiments, the field oxide structure 214 and/or the active region 212 are omitted. In some embodiments, the substrate 210 includes: an elementary semiconductor such as silicon or germanium in crystal, polycrystalline, or an amorphous structure; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, the substrate 210 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. Furthermore, in some embodiments, the semiconductor substrate is a semiconductor on insulator. In some examples, the semiconductor substrate includes a doped epitaxial (epi) layer or a buried layer. In other examples, the compound semiconductor substrate has a multilayer structure, or the substrate includes a multilayer compound semiconductor structure.

Integrated circuit 200 also has electrical devices and features formed over a semiconductor substrate 210 (corresponding to operation 110 (FIG. 1)). For example, a plurality of gate structures 216a-216c is formed over an upper surface 215 of the substrate 210. Gate structures 216a and 216b are positioned over the active region 212 for forming one or more transistors, and gate structure 216c is positioned over the field oxide structure 214 for connecting gate terminals of transistors. In some embodiments, gate structure 216a, 216b, or 216c is a polysilicon gate, a metal gate, or a high-dielectric constant dielectric material/metal (high-k/metal) gate.

Then, as depicted in FIG. 2B, a local interconnection layer 240 is formed either over the substrate 210 and/or over the electrical devices and features formed over the substrate 210. Local interconnection layer 240 has a lower local interconnection layer 220 formed over the substrate 210 and an upper local interconnection layer 230 formed over the lower local interconnection layer 220.

The lower local interconnection layer 220 includes conductive structures 222a and 222b formed within an interlayer dielectric layer 224. The upper local interconnection layer 230 includes conductive structures 232a, 232b, and 232c formed within an interlayer dielectric layer 234. The conductive structures 222a-222b and 232a-232c are provided for electrically connecting components either: within the individual electrical devices; among one of the electrical devices and its adjacent electrical devices; or vertically between the devices and the global interconnection layer 250 (FIG. 2C). Each interlayer dielectric layer 224 or 234 has one or more etch stop layers 228 or 238 formed thereunder. In some embodiments, the etch stop layers 228 and 238 comprise silicon nitride, silicon oxynitride, silicon carbide, silicon oxycarbide, silicon carbon nitride, other dielectric materials, and/or combinations thereof. In some embodiments, the interlayer dielectric layers 224 and 234 comprise undoped silicate glass (USG), boron-doped silicate glass (BSG), phosphor-doped silicate glass (PSG), boron-phosphor-doped silicate glass (BPSG), silicon oxy-nitride, silicon nitride, a low dielectric constant (low-k) material, a ultra low-k dielectric material, and/or combinations thereof.

In some embodiments, the etch stop layers 228 and 238 and the interlayer dielectric layers 224 and 234 are formed by atomic layer deposition (ALD), chemical vapor deposition (CVD), remote plasma CVD (RPCVD), plasma enhanced CVD (PECVD), metal organic CVD (MOCVD), other suitable processes, and/or combinations thereof.

In at least one embodiment, the conductive structures 232a-232c of the upper local interconnection layer 230 are provided for electrical connection between a feature (i.e., a semiconductor component or line) formed over the substrate 210 and the conductive structures 252a-252c (FIG. 2C) of the global interconnection layer 250. The feature mentioned above has a height equal to or greater than a predetermined height H above the upper surface 215 of the substrate 210 (such as the gate structures 216a-216c and the conductive structures 222a-222b). The conductive structures 222a-222b of the lower local interconnection layer 220 are provided for electrical connection between a feature, having a height less than the predetermined height H above the upper surface 215 of the substrate 210, (such as the conductive features of drain/source terminals of a transistor or isolation structures) and the conductive structures 232a-232c of the upper local interconnection layer 250.

In some embodiments, a resistor of the integrated circuit 200 is formed by one or more of the conductive structures 222a-222b and 232a-232c of the local interconnection layer 240 (corresponding to operation 120 (FIG. 1)). In at least one embodiment, the resistor formed by one or more conductive structures 222a-222b and 232a-232c of the local interconnection layer 240 has a resistance value greater than 50 ohms. In contrast, conductive structures 222a-222b and 232a-232c of the local interconnection layer 240 in other context are normally designed to have lowest possible resistance values, usually no greater than 50 ohms, while electrically connecting various semiconductor features.

In some embodiments, the conductive structures 222a-222b and 232a-232c comprise a metallic material that is compatible with silicon (Si) or silicon germanium (SiGe) materials, such as tungsten (W), titanium (Ti), titanium nitride (TiN), or tantalum (Ta). In some embodiments, the conductive structures 222a-222b and 232a-232c comprise a conductive metallic material including aluminum, aluminum-copper alloy, or copper.

In some embodiments, the conductive structures 222a-222b and 232a-232c are formed by atomic layer deposition (ALD), chemical vapor deposition (CVD), remote plasma CVD (RPCVD), plasma enhanced CVD (PECVD), metal organic CVD (MOCVD), Dual Damascene other suitable processes, and/or combinations thereof.

In at least one embodiment, the conductive structures 222a-222b and 232a-232c of the local interconnection layer 240 have a unit resistance value ($\rho'$) ranging from 5 to 26 ohms. In some embodiments, the conductive structures 222a-222b and 232a-232c of the local interconnection layer 240 have a width ranging from 10 nanometers to 80 nanometers. Also, compared with a counterpart polysilicon or active region resistor, no additional mask is necessary to form a resistor with conductive structures 222b and 232a-232c of the local connection layer 240.

Then, as depicted in FIG. 2C, a global interconnection layer 250 is formed over the local interconnection layer 240 (corresponding to operation 130 (FIG. 1)). The global interconnection layer 250 includes conductive structures 252a, 252b, and 252c formed within an interlayer dielectric layer 254. Although there is only one interlayer dielectric layer 254 with conductive structures 252a, 252b, and 252c formed within the interlayer dielectric layer 254 in the embodiment depicted in FIG. 2C, in other embodiments, the global interconnection layer 250 includes stacked interlayer dielectric layers similar to the interlayer dielectric layer 254. The conductive structures 252a-252c are provided for electrically interconnecting the electrical devices via the conductive structures 222a-222b and 232a-232c.

In at least one embodiment, interlayer dielectric layer 254 has one or more etch stop layers 248 formed thereunder. In some embodiments, the etch stop layer 248 comprise silicon nitride, silicon oxynitride, silicon carbide, silicon oxycarbide, silicon carbon nitride, other dielectric materials, and/or any combinations thereof. In some embodiments, the interlayer dielectric layer 254 comprises undoped silicate glass (USG), boron-doped silicate glass (BSG), phosphor-doped silicate glass (PSG), boron-phosphor-doped silicate glass (BPSG), silicon oxy-nitride, silicon nitride, a low dielectric constant (low-k) material, a ultra low-k dielectric material, and/or combinations thereof. In some embodiments, the etch stop layer 248 and the interlayer dielectric layer 254 are formed by atomic layer deposition (ALD), chemical vapor deposition (CVD), remote plasma CVD (RPCVD), plasma enhanced CVD (PECVD), metal organic CVD (MOCVD), other suitable processes, and/or combinations thereof.

Figure 3A:
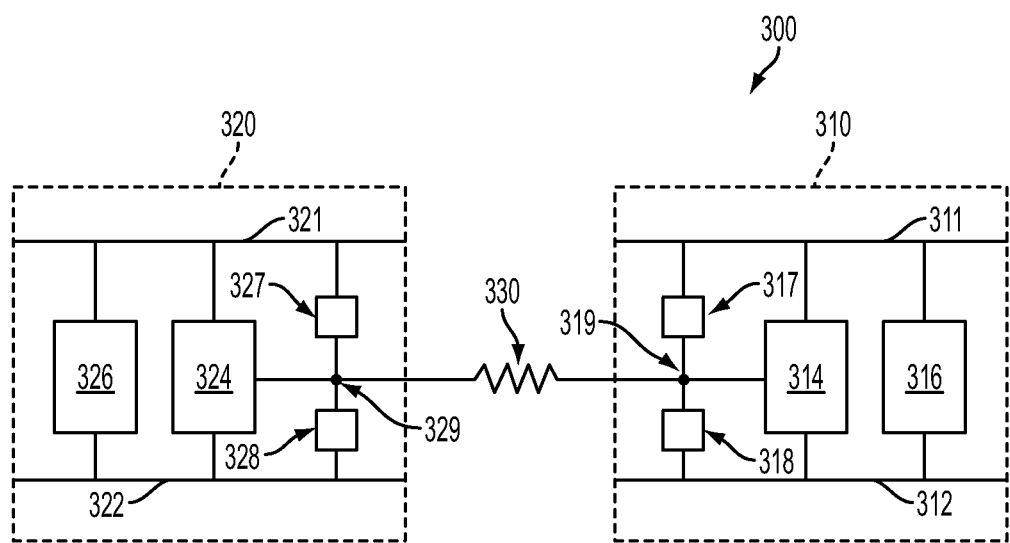
FIG. 3A is a high-level circuit diagram of an integrated circuit including a resistor in accordance with some embodiments.
Figure 3B:
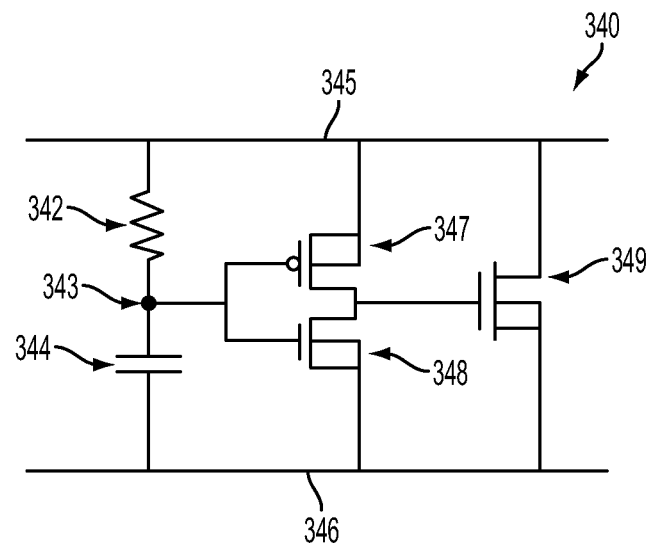
FIG. 3B is a circuit diagram of an ESD protection circuit including a resistor in accordance with some embodiments.

FIGS. 3A and 3B depict example applications of forming the resistor in a local interconnection layer as described above in a semiconductor integrated circuit.

FIG. 3A is a high-level circuit diagram of an integrated circuit 300 including a resistor in accordance with some embodiments. Integrated circuit 300 includes a sub-circuit 310 and a sub-circuit 320. Sub-circuit 310 includes power lines 311 and 312 and a circuit block 314 powered by a power domain defined by power lines 311 and 312. The circuit block 314 has electrical components interconnected to perform one or more functions such as data storage, processing, analog signal processing, and/or digital signal processing, etc. In some embodiments, power line 311 is coupled to a positive voltage source and power line 312 is coupled to a negative voltage source or ground.

The sub-circuit 310 and sub-circuit 320 are susceptible to damage caused by electrostatic discharge (ESD) events. An ESD event refers to a momentary current surge flows to, from, or within a circuit, where the momentary current surge has an excessive amount of current and may cause damage to the circuit. ESD protection circuits are usually implemented in a chip to protect the devices and circuits on the chip from ESD damage. Sub-circuit 310 includes an ESD clamp circuit 316 positioned between the power lines 311 and 312 for providing a conducting path between power lines 311 and 312 during the occurrence of an ESD event. In addition, sub-circuit 310 has an ESD protection circuit including ESD devices 317 and 318 (also known as "secondary ESD devices") connected in series between the power line 311 and the power line 312. In some embodiments, the secondary ESD devices comprise a STI diode, a gated diode, a Metal-Oxide Semiconductor Field Effect Transistor (MOSFET), and/or Bipolar Junction Transistor (BJT). Secondary ESD devices 317 and 318 are not forwardly biased during a normal operation mode (i.e., without an ESD event). An input/output (I/O) node 319 is defined between the secondary ESD devices 317 and 318. The I/O node 119 is the connection point of the secondary ESD devices 317/318 and the circuit block 314.

Sub-circuit 320 includes power lines 321 and 322 and a circuit block 324 powered by a power domain defined by power lines 321 and 322. The circuit block 324 has electrical components interconnected to perform one or more functions such as data storage, processing, analog signal processing, and/or digital signal processing. In some embodiments, power line 321 is coupled to a positive voltage source and power line 322 is coupled to a negative voltage source or ground. The power lines 311, 312, 321, and 322 are arranged to define two different power domains for sub-circuit 310 and sub-circuit 320, respectively. In other words, circuit block 314 is not powered by the power domain defined by power lines 321 and 322, and circuit block 324 is not powered by the power domain defined by power lines 311 and 312.

Sub-circuit 320 also includes an ESD clamp circuit 326 positioned between the power lines 321 and 322. ESD clamp circuit 326 is similar to the ESD clamp circuit 316. Similarly, sub-circuit 320 has an ESD protection circuit including diodes 327 and 328 connected in series between the power line 321 and the power line 322. Diodes 327 and 328 are not forwardly biased during a normal operation mode. An input/output (I/O) node 329 is defined between diodes 327 and 328. The I/O node 329 is the connection point of diodes 327/328 and the circuit block 324.

Integrated circuit 300 further includes a resistor 330 coupled between the I/O node 319 and the I/O node 329. Resistor 330 is capable of limiting a current level flows between nodes 319 and 329. In some embodiments, resistor 330 comprises one or more conductive structures in the local interconnection layer, and a total resistance value of the one or more conductive structures of the resistor 330 ranges from 50 ohms to 400 ohms for effectively limiting ESD current into protected circuit. Moreover, although resistor 330 is coupled to the sub-circuit 320 in the embodiment depicted in FIG. 3A, in some embodiments, the sub-circuit 320 is replaceable by an input/output (I/O) pad of the integrated circuit 300, and resistor 330 is coupled between the I/O pad and the sub-circuit 310. The I/O pad is used to electrically couple the I/O node 319 with an external circuit that is not directly powered by the power domain defined by power lines 311 and 312.

FIG. 3B is a circuit diagram of an ESD protection circuit including a resistor in accordance with some embodiments. In some embodiments, the ESD protection circuit 340 depicted in FIG. 3B functions as the ESD clamp circuit 316 or 326 depicted in FIG. 3A. The ESD protection circuit 340 includes a resistor 342 and a capacitor 344 coupled in series. The resistor 342 has a first end coupled to a power line 345 and a second end coupled to the capacitor 344 at node 343. The capacitor 344 has a first end coupled to a power line 346 and a second end coupled to the resistor 342 at node 343. In some embodiments, resistor 342 comprises one or more conductive structures in the local interconnection layer. The ESD protection circuit 340 also includes a PMOS transistor 347 and NMOS transistors 338 and 349. PMOS transistor 347 and NMOS transistor 348 are connected as an inverter powered by the power lines 345 and 346. The gate terminals of PMOS transistor 347 and NMOS transistor 348 are coupled to the node 343 that connects the second end of the capacitor 344 and the second end of the resistor 342. The drain/source terminals of NMOS transistor 349 are coupled to power lines 345 and 346, respectively, and the gate terminal of NMOS transistor 349 is coupled to the drain terminals of PMOS transistor 347 and NMOS transistor 348.

During the occurrence of an ESD event, the voltage difference between power lines 345 and 346 exceeds a predetermined threshold for normal operation. The combination of resistor 342 and capacitor 344 delays the time the gate terminals of the PMOS transistor 347 and the NMOS transistor 348 need to charge capacitor 344 to a voltage level equal to the voltage difference between power lines 345 and 346. Therefore, before capacitor 344 is charged to match the voltage difference between power lines 345 and 346, PMOS transistor 347 will be temporarily turned on, and subsequently turn on NMOS transistor 349. NMOS transistor 349, at a turned-on state, provides a conducting path between power lines 345 and 346 to discharge the excessive voltage difference therebetween. After the capacitor 344 is charged to match the voltage difference between power lines 345 and 346, usually after the voltage difference between power lines 345 and 346 returns to (or below) the predetermined threshold for normal operation, the gate terminal of PMOS transistor 347 is pulled to a high logic state, which turns PMOS transistor 347 off and subsequently turns NMOS transistor 349 off. In some embodiments, the combination of resistor 342, capacitor 344, PMOS transistor 347, and NMOS transistor 348 is also referred to as an ESD detection circuit because it turns on/off the NMOS transistor 349 in response to occurrence of an ESD event as described above. In some embodiments, the total resistance value of the one or more conductive structures of the resistor 342 ranges from $2.0 \times 10^6$ ohms to $1.0 \times 10^7$ ohms for detecting ESD within a predetermined response time.

Figure 4:
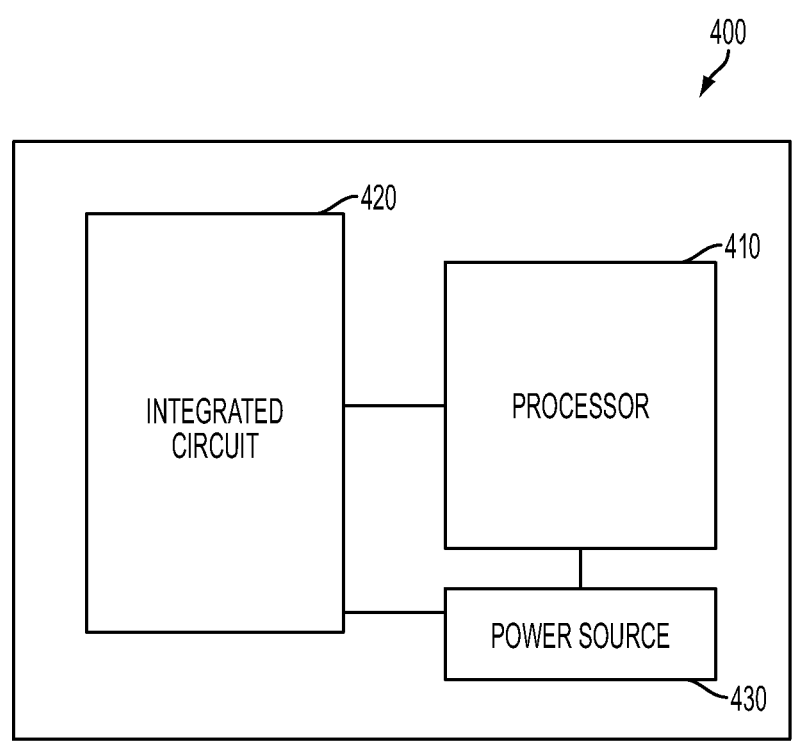
FIG. 4 is a functional block diagram of a computer system including a semiconductor integrated circuit similar to the one depicted in FIG. 2 in accordance with some embodiments.

FIG. 4 is a functional block diagram of a computer system including a semiconductor integrated circuit similar to the one depicted in FIG. 2, in accordance with some embodiments. Computer system 400 includes a processor 410, an integrated circuit 420 as depicted in FIG. 2, and a power source circuit 430. The power source circuit 430 is connected with the processor 410 and the integrated circuit 420 to supply the power for driving the processor 410 and the integrated circuit 420.

In some embodiments, the integrated circuit 420 includes, for example, an LCD driver internal circuit, a static random access memory (SRAM) array, an embedded SRAM array, a dynamic random access memory (DRAM) array, an embedded DRAM array, a field-programmable gate array, a non-volatile memory, e.g., FLASH, EPROM, E2PROME, a logic internal circuit, an analog internal circuit, a mixed-signal internal circuit, other integrated circuits, and/or combinations thereof. In at least one embodiment, the processor 410 and the power source 430 also include the ESD protection circuits similar to the ones depicted in FIGS. 3A and 3B and have a structure similar to the one depicted in FIG. 2.

According to some embodiments, a semiconductor integrated circuit includes a substrate having electrical devices formed thereon, a local interconnection layer formed over the substrate, and a global interconnection layer formed over the local interconnection layer. The local interconnection layer has a first set of conductive structures arranged to electrically connect: within the individual electrical devices; among one of the electrical devices and its adjacent electrical devices; or vertically between the devices and the global interconnection layer. At least one of the first set of conductive structures is configured to have a resistance value greater than 50 ohms. The global interconnection layer has a second set of conductive structures arranged to electrically interconnect the electrical devices via the first set conductive structures.

According to some embodiments, a semiconductor integrated circuit includes a first power line, a second power line, and an electrostatic discharge (ESD) protection circuit coupled between the first power line and the second power line. The ESD protection circuit has a resistor, where the resistor has a conductor formed in a local interconnection layer of the semiconductor integrated circuit, and the conductor has a resistance value greater than 50 ohms.

According to some embodiments, a method of forming a semiconductor integrated circuit includes forming electrical devices over a semiconductor substrate, forming a local interconnection layer over the substrate, and forming a global interconnection layer over the local interconnection layer. The local interconnection layer has a first set of conductive structures arranged to electrically connect components within the individual electrical devices, among one of the electrical devices and its adjacent devices, or vertically between the devices and the global interconnection layer. At least one of the first set of conductive structures is configured to have a resistance value greater than 50 ohms for limiting ESD current into protected circuit. The global interconnection layer has a second set of conductive structures arranged to electrically interconnect the electrical devices via the first set conductive structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor integrated circuit, comprising:
a substrate having electrical devices formed thereon, wherein at least one electrical device of the electrical devices is part of an electrostatic discharge (ESD) protection circuit;
a local interconnection layer formed over the substrate; and
a global interconnection layer formed over the local interconnection layer,
the local interconnection layer having a first set of conductive structures arranged to electrically connect:
within the electrical devices,
among one of the electrical devices and an adjacent one of the electrical devices, or
vertically between the electrical devices and the global interconnection layer, and
at least one conductive structure of the first set of conductive structures is a resistor having a resistance value greater than 50 ohms, and
the global interconnection layer having a second set of conductive structures arranged to electrically interconnect the electrical devices via the first set conductive structures,
wherein a resistance value of the at least one conductive structure of the first set of conductive structures is determined based on a unit resistance value multiplied by a ratio of a length of the at least one conductive structure of the first set of conductive structures to a width of the at least one conductive structure of the first set of conductive structures, and the unit resistance value is equal to or greater than 5 ohms.

2. The semiconductor integrated circuit of claim 1, wherein the at least one conductive structure of the first set of conductive structures has a width ranging from 10 nanometers to 80 nanometers.

3. The semiconductor integrated circuit of claim 1, wherein the at least one conductive structure of the first set of conductive structures comprises tungsten (W), titanium (Ti), titanium nitride (TiN), or tantalum (Ta).

4. The semiconductor integrated circuit of claim 1, wherein the local interconnection layer comprises a lower local interconnection layer and an upper local interconnection layer over the lower local interconnection layer, and the first set of conductive structures comprises a third set of conductive structures and a fourth set of conductive structures, the upper local interconnection layer comprises the third set of conductive structures configured to connect between a feature, having a height equal to or greater than a predetermined height above an upper surface of the substrate, and the second set of conductive structures, and the lower local interconnection layer comprises the fourth set of conductive structures configured to connect between another feature, having a height less than the predetermined height above the upper surface of the substrate, and the third set of conductive structures.

5. The semiconductor integrated circuit of claim 4, wherein the at least one conductive structure of the first set of conductive structures comprises one or more conductive structures of the third and fourth sets of conductive structures.

6. The semiconductor integrated circuit of claim 4, further comprising a gate structure having an upper surface no higher than the predetermined height above the upper surface of the substrate.

7. A semiconductor integrated circuit, comprising:
a first power line;
a second power line;
an electrostatic discharge (ESD) protection circuit coupled between the first power line and the second power line, the ESD protection circuit comprising a resistor, the resistor having a conductor formed in a local interconnection layer of the semiconductor integrated circuit, and the conductor having a resistance value greater than 50 ohms;
a substrate having electrical devices formed thereon, wherein at least one electrical device of the electrical devices is part of the ESD protection circuit; and
a gate structure over the substrate, the gate structure having an upper surface, and the local interconnection layer comprising a conductive structure no higher than the upper surface of the gate structure.

8. The semiconductor integrated circuit of claim 7, wherein the conductor has a width ranging from 10 nanometers to 80 nanometers.

9. The semiconductor integrated circuit of claim 7, wherein the conductor comprises tungsten (W), titanium (Ti), titanium nitride (TiN), or tantalum (Ta).

10. The semiconductor integrated circuit of claim 7, wherein the local interconnection layer comprises a lower local interconnection layer and an upper local interconnection layer, the lower local interconnection layer formed over a substrate of the semiconductor integrated circuit, and the upper local interconnection layer formed over the lower local interconnection layer,
the upper local interconnection layer comprises a first set of conductive structures configured to connect between a feature and a global interconnection layer of the semiconductor integrated circuit, the feature having a height equal to or greater than a predetermined height above an upper surface of the substrate, and
the lower local interconnection layer comprises a second set of conductive structures configured to connect between another feature and the first set of conductive structures, the another feature having a height less than the predetermined height above the upper surface of the substrate.

11. The semiconductor integrated circuit of claim 10, wherein the conductor comprises at least one conductive structure of the upper or lower local interconnection layers.

12. The semiconductor integrated circuit of claim 10, wherein a resistance value of the conductor is determined based on a unit resistance value multiplied by a ratio of a length of the conductor to a width of the conductor, and the unit resistance value is equal to or greater than 5 ohms.

13. The semiconductor integrated circuit of claim 7, wherein the ESD protection circuit comprises:
a capacitor having a first end and a second end, the first end of the capacitor being coupled to the first power line; and
the resistor having a first end and a second end, the first end of the resistor coupled to the second end of the capacitor, and the second end of the resistor coupled to the second power line.

14. The semiconductor integrated circuit of claim 13, wherein the resistance value of the conductor ranges from $2.0 \times 10^6$ ohms to $1.0 \times 10^7$ ohms.

15. The semiconductor integrated circuit of claim 7, wherein the ESD protection circuit comprises:
an input/output node;
the resistor having a first end and a second end, the first end of the resistor coupled to the input/output node, and the second end of the resistor configured to be coupled to a circuit that is not directly powered by the first power line and the second power line.

16. The semiconductor integrated circuit of claim 15, wherein the resistance value of the conductor ranges from 50 ohms to 400 ohms.

17. A semiconductor integrated circuit comprising:
a first power line configured to carry a first voltage;
a second power line configured to carry a second voltage different from the first voltage;
a first electrostatic discharge (ESD) protection circuit coupled to the first power line and the second power line;
a first input/output node coupled to the first power line and the second power line;
a third power line configured to carry a third voltage;
a fourth power line configured to carry a fourth voltage different form the third voltage;
a second ESD protection circuit coupled to the third power line and the fourth power line;
a second input/output node coupled to the third power line and the fourth power line;
a resistor having a first end coupled to the first input/output node and a second end coupled to the second input/output node, wherein the resistor has a resistance value greater than 50 ohms; and
a substrate having electrical devices formed thereon, wherein at least one electrical device of the electrical devices is part of the first ESD protection circuit or the second ESD protection circuit.

18. The semiconductor integrated circuit of claim 17, further comprising:
a first circuit block coupled to the first power line and the second power line, wherein the first circuit block is coupled to the first input/output node; and
a second circuit block coupled to the third power line and the fourth power line, wherein the second circuit block is coupled to the second input/output node.

19. The semiconductor integrated circuit of claim 17, further comprising:
a first secondary ESD device coupled between the first input/output node and the first power line;
a second secondary ESD device coupled between the first input/output node and the second power line;
a third secondary ESD device coupled between the second input/output node and the third power line; and
a fourth secondary ESD device coupled between the second input/output node and the fourth power line.

20. The semiconductor integrated circuit of claim 17, wherein the third voltage is different from the first voltage or the fourth voltage is different from the second voltage.

* * * * *